United States Patent [19]

Sodd

[11] Patent Number: 4,706,218
[45] Date of Patent: Nov. 10, 1987

[54] MEMORY INPUT BUFFER WITH HYSTERESIS

[75] Inventor: Lal C. Sodd, Austin, Tex.

[73] Assignee: Motorola, Inc., Schaumburg, Ill.

[21] Appl. No.: 823,447

[22] Filed: Jan. 28, 1986

[51] Int. Cl.$^4$ .................. G11C 13/00; G11C 11/40
[52] U.S. Cl. ................................. 365/189; 365/230; 365/149
[58] Field of Search ............. 365/149, 150, 182, 189, 365/230

[56] References Cited

U.S. PATENT DOCUMENTS 4,581,718 4/1986 Oishi .................................. 365/230

*Primary Examiner*—Terrell W. Fears
*Assistant Examiner*—Melissa J. Koval
*Attorney, Agent, or Firm*—John A. Fisher; Jeffrey Van Myers; James L. Clingan, Jr.

[57] ABSTRACT

A memory has input buffer which provides high immunity to problems associated with address float while providing high speed for both decoder selection and for transition detection. The input buffer includes an input inverter with hysteresis as well as a cross coupled latched for avoiding problems with a slow moving input signal. The cross coupled latch is a NAND gate latch to provide for a quick logic low to logic high transition which is favorable for quick transition detection. A second inverter provides a feedback signal to a feedback transistor which provides hysteresis for the first inverter. A load is placed in series with the feedback transistor for use in obtaining the desired hysteresis. The feedback transistor can thus have a minimum gate area to minimize the capacitance added by the feedback transistor to the output of the second inverter while the load can be varied as desired for optimizing the hysteresis.

16 Claims, 3 Drawing Figures

MEMORY INPUT BUFFER WITH HYSTERESIS

CROSS-REFERENCE TO RELATED APPLICATONS

Related subject matter is disclosed in U.S. application Ser. No. 823,446, entitled "High Speed Equalization In A Memory," filed simultaneously herewith and assigned to the assignee hereof.

FIELD OF THE INVENTION

The present invention relates to input buffers, and more particularly, to memory input buffers with hysteresis which are particularly useful as address buffers.

BACKGROUND OF THE INVENTION

In memories input buffers are required for address signals, data signals, and control signals such as a chip enable signal or a write enable signal. In these applications it is generally desirable for the input buffer to have high speed and low power. More subtle considerations include noise immunity and address float. Address float occurs when the input address is allowed to be simply high impedance so that the input voltage is not driven to any particular state but is allowed to "float." Although particularly common for addresses, this can be true for other signals as well. Outputs of microprocessors which provide the address signals are commonly tri-stated between active cycles. It is desirable that the input buffer not cause problems internal to the memory in this type of case. One thing that is desired is for the memory to not respond to a floating address as numerous transitions. In many memories, particularly static random access memories (SRAMs), the memory is designed to respond to address transitions. In such a memory most of the power consumption is in response to an address transition. Accordingly, it is desirable that during address float, which may result in any D.C. input voltage, that the address buffer not oscillate back and forth between two logic states. Additionally, for slow address transitions there may be a small amplitude, high frequency signal superimposed on the slow moving input signal. In such case there can be a response back and forth to the high frequency signal when the input signal is near the switch point of the input buffer. These problems have been addressed by providing hysteresis to change the switch point after the switch point has been initially reached. Although hysteresis has been useful in dealing with the problems of a floating or slow moving input, adding hysteresis has also resulted in reduced speed and/or increased circuit complexity with the consequent chip area penalty. Another problem with address float and the accompanying D.C. voltage level which can foreseeably be anywhere between the power supply voltages (voltages outside the power supply voltages present problems more associated with input protection than signal interpretation), is that the address may be interpreted as being a logic high for some portions of the internal circuit while interpreted as a logic low for some other portions. This can have the undesirable result of selecting two decoders which are intended to be exclusive of each other. Another criterion, for typical SRAM applications, is that the address buffer must be able to conveniently provide signals needed for address transition detection.

SUMMARY OF THE INVENTION

An object of the present invention is to provide an improved input buffer.

Another object of the invention is to provide an input buffer with improved hysteresis.

Yet another object of the invention is to provide an input buffer with improved response to a floating input.

These and other objects are achieved in an input circuit having a first transistor of a first conductivity type, a second transistor of a second conductivity type, an inverter, a third transistor of the first conductivity type, a load, and an output circuit. The first transistor has a first current electrode coupled to a first power supply terminal, a second current electrode coupled to a switch point control node, and a control electrode for receiving an input signal. The second transistor has a first current electrode coupled to a second power supply terminal, a second current electrode coupled to the switch point control node, and a control electrode for receiving the input signal. The inverter has an input coupled to the switch point control node, and an output. The load and the third transistor are coupled in series between the first power supply terminal and the switch point control node. The third transistor has a control electrode coupled to the output of the inverter. The load limits the current through the third transistor. The output circuit is coupled to the inverter and provides an output signal.

DESCRIPTION OF THE INVENTION

Figure 1:
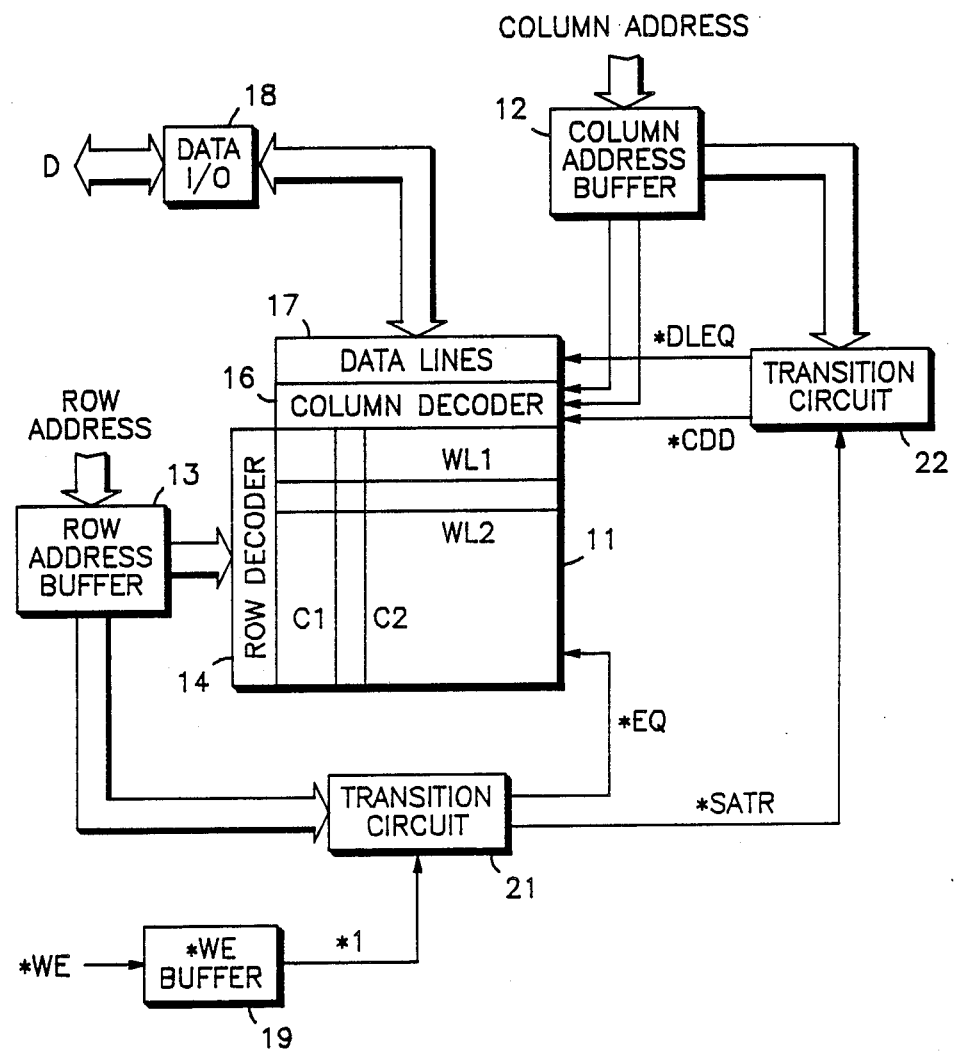
FIG. 1 is a block diagram of a memory according to a preferred embodiment of the invention.

Shown in FIG. 1 is a static random access memory (SRAM) 10 comprised generally of an array of SRAM cells 11; a column address buffer 12 having an input for receiving a column address buffer, a first output, and a second output; a row address buffer 13 having a input for receiving a row address, a first output, and a second output; a row decoder 14 coupled to the first output of the row address buffer and to array 11; a column decoder 16 coupled to the first output of column address buffer 12 and to array 11; a data I/O circuit 18 coupled to data lines 17 for receiving data D from external pins (not shown) in a write mode and providing data D to the external pins in a read mode; a write enable (*WE) buffer 19 having an input for receiving a write enable signal *WE; a transition circuit 21 having a first input coupled to the second output of row address buffer 13, a second input coupled to the output of *WE buffer 19, a first output for providing signal *EQ to array 11, and a second output for providing a summation of address transitions signal *SATR; and a transition circuit 22 having a first input connected to the second output of column address buffer 12, a second input connected to the second output of transition circuit 21 for receiving signal *SATR, a first output connected to data lines 17 for providing a data line equalization signal *DLEQ, and a second output connected to column decoder 16 for providing a column decoder disable signal *CDD. Array 11 has memory cells located at intersections of word lines and bit line pairs as is conventional for a SRAM. Memory 10 is organized in a x8 configuration so that a byte of data is provided as data D. Shown in array 11 are word lines WL1 and WL2 and columns C1 and C2. Each column is comprised of 8 bit line pairs. Row decoder 14 decodes the row address received via buffer 13 to enable a word line selected by the row address. Column decoder 16 decodes the column address received via buffer 12 to couple a column selected by the column address to data lines 17. If memory 10 is in the write mode, data D is input to the selected column via data I/O 18 and data lines 17. If memory 10 is in the read mode, data D is output from the selected column via data lines 17 and data I/O 18.

Figure 3:
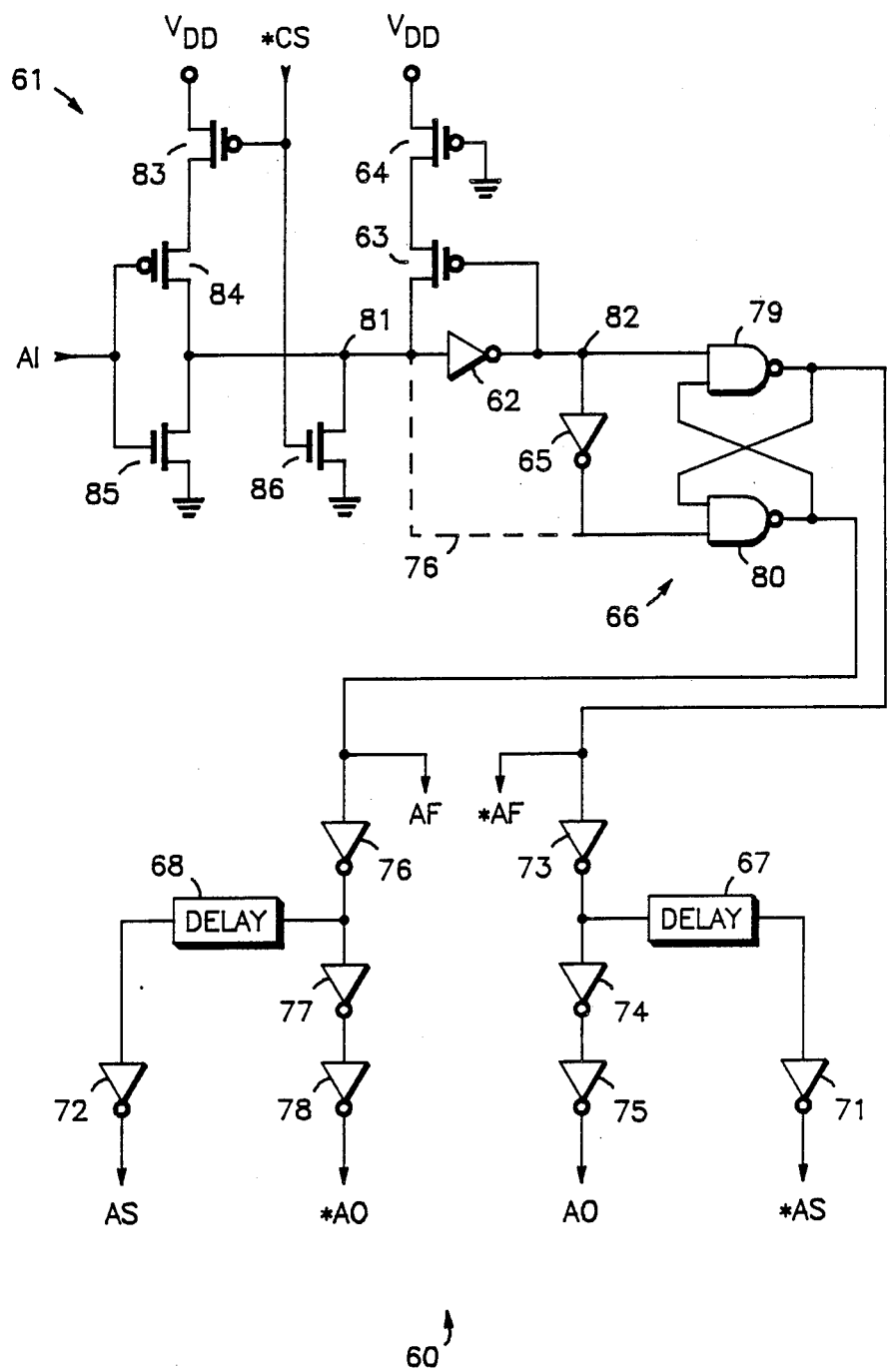
FIG. 3 is a combination logic and circuit diagram of an address buffer of the memory of FIG. 1 according to a preferred embodiment of the invention.

If there is a row or column address change, then a new memory location will either provide data D or receive data D. If there is a row address change, all of the bit lines in array 11 and data lines 17 will be equalized. Transition circuit 21 detects a row address change by detecting a change in any one of the address signals which comprise the row address. This is achieved by generating a transition pulse (not shown) for each address signal which changes logic state. Each row address signal has its own buffer circuit which is coupled to transition circuit 21 and row decoder 14. An address buffer circuit shown in FIG. 3 is exemplary of those used in row address buffer 13 and is believed to offer advantages over those of the prior art. Other buffer circuits of the prior art, however, could also be used for the transition detection and row decoding purposes required in FIG. 1. In response to the generation of one or more of these transition pulses as a result of a row address change, signals *EQ and *SATR are generated. The asterisk (*) is used to indicate that a signal is active when it is a logic low. Signals *EQ and *SATR are active as negative going pulses of about 10 nanoseconds (ns) duration at a logic low. Signal *EQ at a logic low causes the bit lines to be equalized. Signal *SATR at a logic low causes transition circuit 22 to generate signals *DLEQ and *CDD. When signal *DLEQ is active as a logic low pulse of about 10 ns duration, data lines 17 are equalized. Signal *CDD, when active, disables column decoder 16 so that no column in array 11 is coupled to data lines 17. While data lines 17 are being equalized, no column is coupled to data lines 17. Transition circuit 22 also detects any change in the column address. If there is a change in any one of the address signals which comprise the column address, signals *DLEQ and *CDD are pulsed to a logic low to equalize data lines 17 and to disable column decoder 16.

Transition circuit 21 receives write enable signal *WE via *WE buffer 19. Transition circuit 21 detects a logic low to logic high transition of signal *WE and generates signals *EQ and *SATR in the same manner as for a row address change. Signal *SATR then causes transition circuit 22 to generate signals *DLEQ and *CDD. Consequently, in response to a write to read transition, the bit lines and the data lines are equalized and column decoder 16 is disabled. Transition circuits 21 and 22 can be made using conventional transition detection techniques. Of course in conventional address transition detection SRAMs, the transition of signal *WE is not detected, but the techniques used for address transition detection in conventional SRAMs are directly applicable to the detection of the transition of signal *WE.

Figure 2:
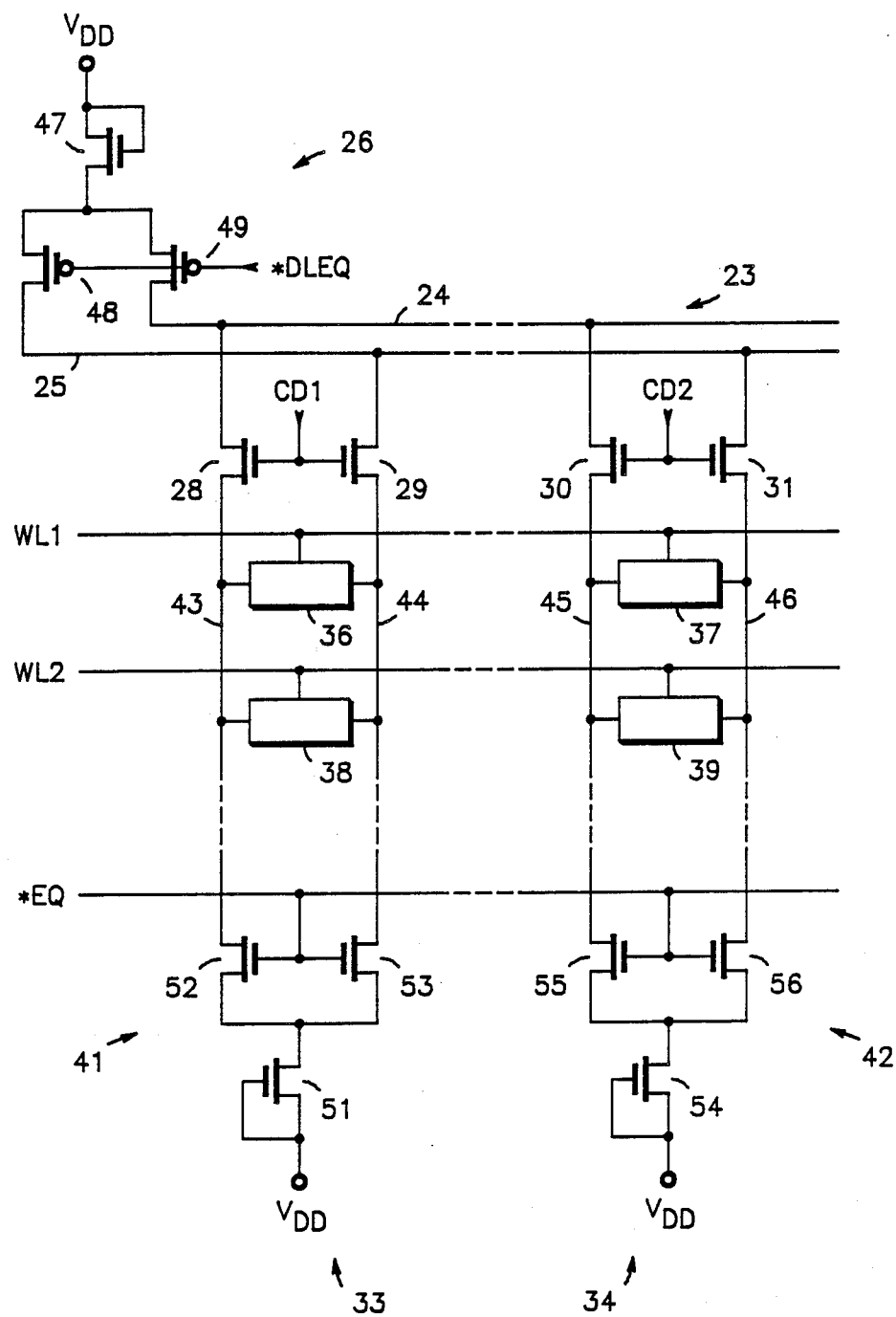
FIG. 2 is a circuit diagram of a portion of the memory of FIG. 1.

Shown in FIG. 2 is a portion of array 11, a portion of data lines 17, and a portion of column decoder 16. The portion of data lines 17 shown in FIG. 2 is a data line pair 23 comprised of a data line 24, a data line 25, and an equalization circuit 26. The portion of column decoder 16 is comprised of coupling transistors 28, 29, 30, and 31. The portion of array 11 shown in FIG. 2 is word lines WL1 and WL2, a bit line pair 33 of column C1, a bit line pair 34 of column C2, a memory cell 36 coupled to word line WL1 and bit line pair 33, a memory cell 37 coupled to word line WL1 and bit line pair 34, a memory cell 38 coupled to word line WL2 and bit line pair 33, a memory cell 39 coupled to word line WL2 and bit line pair 34, an equalization circuit 41 coupled to bit line pair 33, and an equalization circuit 42 coupled to bit line pair 34. Bit line pair 33 is comprised of bit lines 43 and 44. Bit line pair 34 is comprised of bit lines 45 and 46. Equalization circuit 26 is comprised of diode-connected N channel transistor 47 having a gate and a drain connected to a positive power supply terminal VDD for receiving a positive power supply voltage, a P channel transistor 48, and a P channel transistor 49. The N channel transistor has a source connected to first current electrodes of P channel transistors 48 and 49. Both P channel transistors have a gate for receiving signal *DLEQ. Transistor 48 has a second current electrode coupled to data line 25. Transistor 49 has a second current electrode coupled to data line 24. Equalization circuits 41 and 42 are the same as equalization circuit 26 except that they are connected to bit line pairs 33 and 34, respectively, and are enabled by signal *EQ instead of signal *DLEQ. Equalization circuit 41 is comprised of N channel transistor 51 and P channel transistors 52 and 53 with the P channel transistors being connected to bit lines 43 and 44, respectively. Equalization circuit 42 is comprised of N channel transistor 54 and P channel transistors 55 and 56 with the P channel transistors being connected to bit lines 45 and 46, respectively. Transistor 28 is an N channel transistor having a first current electrode connected to data line 24, a second current electrode coupled to bit line 43, and a control electrode for receiving a column decoder output signal CD1. Transistor 29 is an N channel transistor having a first current electrode connected to data line 25, a second current electrode coupled to bit line 44, and a control electrode for receiving a column decoder output signal CD1. Transistor 30 is an N channel transistor having a first current electrode connected to data line 24, a second current electrode coupled to bit line 45, and a control electrode for receiving a column decoder output signal CD2. Transistor 31 is an N channel transistor having a first current electrode connected to data line 25, a second current electrode coupled to bit line 46, and a control electrode for receiving a column decoder output signal CD2.

In performing a write, the selected bit line pair and the data line pair 23 are polarized to write data into the selected memory cell. In the case of a write, the polarization of bit lines and data lines is full rail or nearly so. The term "full rail" means that the full power supply voltage is reached. During a write, there is nearly full rail polarization of the data lines and the selected bit lines which means that one of the pair is at ground and the other is near the voltage of VDD, which can be, for example, 5 volts. The actual voltage reached is one N channel threshold voltage, including body effect, down from VDD. Such a threshold voltage can be 1.0 volt so that one selected bit line is at about 4.0 volts and the other is at ground. Assume that memory cell 36 is to be written with a logic high on bit line 43. To perform a write on memory cell 36 word line WL1 is enabled and column decoder 16 provides signal CD1 at logic high to cause bit lines 43 and 44 to be coupled to data lines 24 and 25, respectively. Data I/O 18 brings data line 24 to voltage at or near VDD and data line 25 to a voltage at or near ground. With signal CD1 at a logic high, the voltage on data line 24 is coupled to bit line 43, and the voltage on data line 25 is coupled to bit line 44. Consequently, bit line pair 33 is polarized to nearly full rail. This is desirable to ensure that memory cell 36 is written to the desired logic state. If the next cycle is a read of memory cell 38, there is a potential problem of reversing the data in memory cell 38 due to bit line pair being of opposite polarization. Memory cell 38 may not be strong enough to overcome the full rail polarization of bit line pair 33 so that the bit lines 43 and 44 may stay in the same logic states as previously written instead of obtaining the logic state of memory cell 38. In such case not only would there be a read of false data but memory cell 38 would assume the logic state of that written onto bit lines 43 and 44 in the preceding write cycle.

In response to the change from a write to a read, signals *DLEQ and *EQ are generated. A transition from a write to a read is indicated by signal *WE switching from a logic low to a logic high which causes signals *DLEQ and *EQ, as well as signal *CDD, to be generated. When activated by signal *DLEQ being a logic low, circuit 26 causes data lines 24 and 25 to be equalized at an N channel threshold voltage below VDD. Due to the well known body effect, the threshold voltage of transistor 47 is increased substantially over that of a grounded source N channel transistor. A typical equalization voltage for a circuit such as circuit 26 with VDD at 5 volts may be 3.5 volts. Similarly equalization circuits 41 and 42 equalize bit line pairs 33 and 34, respectively, in response to signal *EQ at a logic low. Whereas the problem occurs primarily on a row change which also causes signal *EQ to be activated with the consequent bit line equalization, there are still advantages to equalizing the bit lines in response to a write to read transition. The time required to equalize is greater following a write than following a read. After a read, the bit lines of a bit line pair are not nearly so far apart in voltage as the nearly full rail separation caused in a write cycle. Because the separation is greater after a write, the time required to correct the separation with the equalization circuitry is greater. With the detection of the write to read transition it is feasible to begin the equalization process sooner than with an address transition detection. One reason this is possible is that it can be achieved by increasing the speed of the write enable buffer. There is a power consumption penalty, but it is worth it because there is only one write enable buffer. In order to have the same increase in speed using address transition detection only, all of the row address buffers would have to have the same power penalty so that the power penalty is multiplied by the number of row address buffers. Another advantage is that a typical transition detector detects transitions in one direction faster than the other. Addresses can change in either direction but the important change for the write enable signal, signal *WE, is from a logic low to a logic high. The transition detector can thus be conveniently made so that the detection of the logic low to logic high transition of the *WE signal is very fast.

A typical specification for SRAMs is that the access time specification must be met even when the write enable signal, signal *WE, switches from a logic low to a logic high at the same time as an address transition. Because the time required to equalize is longer following a write cycle due to near full rail polarization of the bit lines and data lines, the access time was longer following a write than following a read. By directly detecting the transition from a write to a read, the equalization can occur just as quickly by beginning the equalization process sooner than it begins with address transition detection only. This results in either being able to specify a faster access time or in improving the margin by which the access time is met. Increasing margin increases yield which is, of course, very desirable. Two other specifications in this regard which are also improved are write high to data don't care (WHDX) and write high to address don't care (WHAX).

Shown in FIG. 3 is an address buffer circuit 60 exemplary of those which comprise row address buffer 13 and column address buffer 12. Row address buffer 13 and column address buffer 12 are each comprised of a plurality of buffer circuits like buffer circuit 60. Buffer circuit 60 comprises generally a NOR gate 61, an inverter 62, a P channel transistor 63, a P channel transistor 64, an inverter 65, a cross-coupled latch 66, a delay circuit 67, a delay circuit 68 and inverters 71, 72, 73, 74, 75, 76, 77, and 78. Cross-coupled latch 66 is comprised of a NAND gate 79 and a NAND gate 80. NOR gate 61 comprises a P channel transistor 83, a P channel transistor 84, an N channel transistor 85, and an N channel transistor 86.

Transistor 84 has a gate for receiving an externally provided address input signal AI, a drain connected to a node 81, and a source. Transistor 83 has a source connected to VDD, a gate for receiving a chip select signal *CS, and a drain connected to the source of transistor 84. Transistor 85 has gate for receiving signal AI, a source connected to ground and a drain connected to node 81. Transistor 86 has a gate for receiving signal *CS, a source connected to ground, and a drain connected to node 81. The gates of transistors 83 and 86 form a first input of NOR gate 61, the gates of transistors 84 and 85 form a second input of NOR gate 61, and node 81 is an output of NOR gate 61.

Inverter 62 has an input connected to node 81, and an output connected to a node 82. Transistor 64 has a source connected to VDD, a gate connected to ground, and a drain. Transistor 63 has a gate connected to the output of inverter 62, a source connected to the drain of transistor 64, and a drain connected to node 81. Inverter 65 has an input connected to node 82, and an output. NAND gate 79 has a first input connected to node 82, an output for providing a complementary fast address signal *AF, and a second input. NAND gate 80 has a first input connected to the output of inverter 65, an output connected to the second input of NAND gate 79 for providing a true fast address signal AF, and a second input connected to the output of NAND gate 80. Inverter 73 has an input connected to the output of NAND gate 79, and an output. Inverter 74 has an input connected to the output of inverter 73, and an output. Inverter 75 has an input connected to the output of inverter 74, and an output for providing buffer circuit true output signal AO. Inverter 76 has an input connected to the output of NAND gate 80, and an output. Inverter 77 has an input connected to the output of inverter 76, and an output. Inverter 78 has an input connected to the output of inverter 77, and an output for providing buffer circuit complementary output signal *AO. Delay circuit 67 has an input connected to the output of inverter 73, and an output. Inverter 71 has an input connected to the output of delay circuit 67, and an output for providing a complementary slow address signal *AS. Delay circuit 68 has an input connected to the output of inverter 76, and an output. Inverter 72 has an input connected to the output of delay circuit 68, and an output for providing a true slow address signal AS.

When memory 10 is deselected, signal *CS is a logic high so that transistor 86 is conducting and transistor 83 is not. This causes node 81 to be held to a logic low regardless of the state of signal AI. When signal *CS is a logic low transistor 83 is conductive and transistor 86 is not so that node 81 is responsive to signal AI. This is conventional NOR gate usage for an input buffer. The condition of interest is when signal *CS is a logic low so that buffer 60 is responsive to signal AI. With signal *CS at a logic low, NOR gate 61 is effectively an inverter with an output responsive to signal AI. NOR gate 61 can also be viewed as a clocked inverter which is enabled when signal *CS is active, indicating that memory 10 is selected. Although a NOR gate is generally considered desirable, a NAND gate could also be used for enabling buffer 60 to be responsive to signal AI under the control of some signal such as a chip select signal.

When signal AI is a logic low, transistors 84 and 85, operating as an inverter, cause node 81 to be a logic high. With node 81 at logic high, inverter 62 makes node 82 a logic low. Node 82 at logic low causes transistor 63 to be conductive, NAND gate 79 to output a logic high, and inverter 65 to output a logic high. Transistor 64 is always conductive. With the outputs of NAND gate 79 and inverter 65 at logic high, NAND gate 80 provides a logic low output. Signal AF is a logic low, and signal *AF is a logic high. Sequentially connected inverters 73-75 comprise an output driver which provides signal AO at the logic state complementary to that of the output of NAND gate 79 so that signal AO is a logic low. Similarly, sequentially connected inverters 76-78 comprise an output driver which provides signal *AO at the logic state complementary to that of the output of NAND gate 80 so that signal *AO is a logic high.

There are two inversion stages between NAND gate 79 and the output of inverter 71 so that signal *AS is provided at the same logic state as that provided on the output of NAND gate 79. Although there is a time delay caused by inverters 73 and 71 and delay circuit 67 between a change in the output of NAND gate 79 and the output of inverter 71 responding to that change, the steady state conditions of the outputs of NAND gate 79 and inverter 71 are the same. Signal *AS is thus a logic high. Similarly, there are two inversion stages between NAND gate 80 and the output of inverter 72 so that signal AS is provided at the same logic state as that provided on the output of NAND gate 80. Although there is a time delay caused by inverters 76 and 72 and delay circuit 68 between a change in the output of NAND gate 80 and the output of inverter 72 responding to that change, the steady state conditions of the outputs of NAND gate 80 and inverter 72 are the same. Signal AS is thus a logic low. Signals AF, AS, and AO correspond to the logic state of input signal AI by being the same logic state. Signals *AF, *AS, and *AO correspond to the logic state of input signal AI by being complementary thereto.

Transistor 63 reinforces the logic condition present on node 81 which is significant as signal AI approaches the switch point of the input, the first input, of NOR gate 61 which receives signal AI. The switch point of a circuit as related to an inverter is the voltage at which the input voltage is the same as the output voltage. For inverting logic gates, which can be considered types of inverters in many applications, there is more than one input. The logic gate can be designed so that different inputs can have different switch points. The switch point of the first input of NOR gate 61 is determined primarily by the gains of transistors 83, 84, and 85. The gain of transistor 83 is made significantly larger than the gain of transistor 84 so that the ratio of the gains of transistors 84 and 85 is the most significant determinant of switch point and the effect of transistor 83 is relatively minor. For active operation in which signal *CS is a logic low, NOR gate 61 operates essentially as an inverter comprised of transistors 84 and 85. The gain of transistor 85 is sufficiently greater than that of transistor 84 to establish a switch point at about 1.4 volts for the case in which VDD is 5.0 volts. Transistors 63 and 64 also affect the switch point.

When transistor 63 is conductive, the switch point of the transistor 84-85 inverter is increased because of the additional current required to flow through transistor 85 as it becomes conductive. As signal AI increases from a logic low at or near ground potential in which transistor 85 is non-conductive, transistor 85 becomes conductive when its threshold voltage is exceeded. As signal AI increases toward a logic high, transistor 85 becomes more conductive as its gate to source voltage increases. This tends to cause node 81 to drop in voltage toward becoming a logic low. Transistor 63 being conductive retards the rate at which transistor 85 can reduce the voltage on node 81. The presence of transistor 63 has the affect of increasing the switch point for the case in which signal AI is switching from a logic low to a logic high. The magnitude of the affect on the switch point of the transistor 84-85 inverter is determined by the conductivity of the current path between VDD and node 81. This conductivity n turn is related to the gains of transistors 63 and 64.

The gain of transistor 63 could be selected to provide the desired change in switch point. The change in switch point is less when node 81 is switching from a logic low to a logic high because transistor 63 is not conductive when node 81 begins at logic low because inverter 62 responds to node 81 being a logic low by providing a logic high output to the gate of transistor 63. While transistor 63 is non-conductive it does not operate to raise the current provided to node 81 beyond that provided through transistor 84. Consequently, the switch point is higher for the case in which signal AI is switching from a logic low to a logic high than from a logic high to a logic low. This difference between switch points, dependent upon the direction of the input signal, is commonly known as hysteresis. The hysteresis provides a margin of safety in avoiding the voltage on node 81 changing direction for a very small change in direction on the input near the switch point.

Although this hysteresis is desirable, the amount of hysteresis that is desired is limited. Too much hysteresis can cause a buffer circuit to become slower when the input switches from a logic low to logic high. Any decrease in speed in the input buffer is very undesirable because it is in the critical path for establishing access time. Another speed consideration is the capacitance that transistor 63 adds to node 82. An capacitance that is added will tend to reduce speed. Consequently, it is desirable to minimize the capacitance added by transistor 63 to node 82. The amount of capacitance added by transistor 63 increases as gate area of transistor 63 increases. In a process in which the minimum gate length is 1.5 microns, a typical minimum gate width is 5 microns. A transistor with a gate width of 5 microns and a gate length of 1.5 microns has a gain which will typically provide more than the desired hysteresis. The gain can be reduced by increasing the gate length but not by decreasing the gate width because the width is already at the minimum. To increase the gate length to 10 microns, for example, would increase the capacitance added to node 82 by transistor 63 by between 6 and 7 times. Transistor 64 is added in series with transistor 63 to add the needed resistance to limit the hysteresis to the desired amount without adding any capacitance to node 82. Transistor 64 is added as a load device to allow the hysteresis to be optimized without adding speed-reducing capacitance to node 82 beyond the capacitance of a minimum gate area transistor.

Transistor 64 could be replaced with some other type load such as an N channel transistor, a depletion transistor, or a polysilicon resistor. The P channel transistor was chosen for size and process tracking reasons. Depletion transistors are not typically available in current typical CMOS processes but a depletion transistor would work well in this application. The disadvantage of an N channel enhancement transistor is that it could not reinforce the voltage on node 81 all the way to VDD. Even so, an N channel transistor could still be effective in this application. Also the order in which the transistor 63 and 64 are connected could be reversed. Transistor 63 could be connected to VDD and the load implemented as transistor 64 could be connected between transistor 63 and node 81. The load, which can be adjusted, is in series with the feedback transistor which is clocked by a signal derived from the signal on node 81.

As the voltage on node 81 drops in response to input signal AI increasing from a logic low toward a logic high, inverter 62 responds by increasing the voltage on node 82. The switch point of inverter 65 is intentionally chosen to be lower than the switch point of the first input of NAND gate 79, the input connected to node 82. Consequently, inverter 65 provides a logic low to the first input of NAND gate 80 before node 82 is recognized as a logic high by the first input of NAND gate 79. A logic low on any input of a NAND gate forces the NAND gate to provide a logic high output. There is thus a voltage range on node 82 defined by the difference in switch points of inverter 65 and the first input of NAND gate 79 over which both NAND gates 79 and 80 will provide a logic high output.

As the voltage on node 82 continues to increase, the first input of NAND gate 79 will respond to the voltage on node 82 as a logic high. With inverter 65 having already provided a logic low to the first input of NAND gate 80, NAND gate 80 has output a logic high to the second input of NAND gate 79 so that upon node 82 reaching a logic high, NAND gate 79 provides a logic low output. Signal AF thus switches from a logic low to a logic high sooner than signal *AF switches from a logic high to a logic low. A delay period, defined by the propagation delays of inverters 73 and 71 and the time delay of delay circuit 67, following signal *AF switching from a logic high to a logic low, signal *AS switches from a logic high to a logic low. Similarly, a delay period, defined by the propagation delays of inverters 76 and 72 and the time delay of delay circuit 68, following signal AF switching from a logic low to a logic high, signal AS switches from a logic low to a logic high.

Signals AF, AS, *AF, and *AS are received by either transition circuit 21 or transition circuit 22, depending upon whether buffer 60 is one of the address buffer circuits of row address buffer 13 or of column address buffer 12, respectively. The time delay between the transition of the fast address signals AF and *AF and the slow address signals AS and *AS is used to generate a transition pulse such as signals *EQ, *SATR, *DLEQ, or *CDD. For a given transistor size, the transition which can be detected most rapidly is the logic low to logic high transition because N channel transistors have a higher mobility than P channel transistors. In circuit 60, the logic low to logic high transition occurs first to take advantage of the superior logic low to logic high transition detection characteristic. In the conventional transition detection circuit, as is used in transition circuits 21 and 22, the transition which initiates the generation of a transition pulse is the logic low to logic high transition on either of the fast signals AF or *AF. The logic high to logic low transition of the corresponding slow signal, which is the slow signal having the opposite active logic state to that of the fast signal which initiated the transition pulse, terminates the transition pulse. For the logic low to logic high transition of signal AI, signal AF switches from a logic low to a logic high to initiate a transition pulse. The logic low to logic high transition occurs first in circuit 60 so that the transition pulse is initiated on the first transition. The logic low to logic high transition of signal AF occurs before the logic high to logic low transition of signal *AF. The transition pulse initiated by the logic low to logic high transition of signal AF is terminated by the logic high to logic low transition of signal *AS.

With input signal AI at logic high, node 81 is a logic low, node 82 is a logic high, transistor 63 is non-conductive, the output of inverter 65 is a logic low, signal AF is a logic low, signal *AF is a logic high, signal AO is logic high, signal *AO is a logic low, signal AS is a logic high, and signal *AS is a logic low. Signals AO and *AO are the address signals which are received by either row decoder 14 or column decoder 16, depending whether circuit 60 is a buffer circuit for row address buffer 13 or column address buffer 12, respectively. Row decoder 14 and column decoder 16 are both comprised of a plurality of decoder circuits. A particular decoder circuit within either row decoder 14 or column decoder 16 receives only one of signals AO and *AO as is conventional. When a received address signal is a logic low, the particular decoder circuit which receives that address signal is deselected. A decoder circuit is selected when all of the address signals received by it are a logic high as is typical for a CMOS decoder circuit. A typical CMOS decoder is implemented as a NAND gate. Circuit 60 is designed to ensure that signals AO and *AO are not a logic high at the same time by providing for the outputs of NAND gates 79 and 80 being both at a logic high for a certain voltage range of node 82 for either a logic low to logic high transition or logic high to logic low transition of input signal AI. Because there are 3 inversion stages between the outputs of NAND gates 79 and 80 and signals AO and *AO, when the outputs of NAND gates 79 and 80 are both a logic high, output signals AO and *AO are a logic low.

When signal AI begins switching from a logic high to a logic low, node 81 begins increasing in voltage but without the help of transistors 63 and 64 supplying current to node 81. After node 81 reaches a sufficiently high voltage, node 82 will be reduced in voltage sufficiently to cause transistor 63 to become conductive and thereby aid in raising the voltage on node 81. With transistor 63 supplying current to node 81, node 81 will be prevented from declining in voltage if there is a small increase in voltage of signal AI. This is the desired hysteresis which helps avoid oscillations on node 81, when signal AI is very slow moving.

Because the switch point of the first input of NAND gate 79 is greater than that of inverter 65, node 82 is interpreted as a logic low by NAND gate 79 at a voltage which is higher than the voltage at which inverter 65 interprets node 82 as a logic low. As the voltage on node 82 drops below the switch point of NAND gate 79, NAND gate 79 will begin providing a logic high output while inverter 65 will continue to provide a logic low output to NAND gate 80. In this condition between the switch points of inverter 65 and the first input of NAND gate 79, node 82 will cause the outputs of both NAND gates 79 and 80 be at a logic high. Because of the three inversion stages between fast signals AF and *AF and output signals AO and *AO, both signals AO and *AO are a logic low, the deselect state for both signals. Consequently, even for an address float condition in which node 82 is not in a clearly defined logic state, output signals AO and *AO can only be at the same logic state at a logic low, the deselect state. Another result, in the case in which both signals AF and *AF are a logic high, is that the transition pulse generated in response to the logic low to logic high transition remains active until one of signals AF and *AF switches to a logic low. With both signals AF and *AF at a logic high, both signals AS and *AS will also be a logic high. The transition pulse is not terminated until the slow signal opposite the polarity of the logic high fast signal switches to a logic low. This is desirable because this means that array 11 will remain equalized during this type of address float and will be ready for an access immediately upon a clear definition of the logic state of the input signal. This also reduces the possibility of any accidental loss of data in array 11.

As node 82 further decreases below the switch point of inverter 65, inverter 65 provides a logic high output which causes NAND gate 80 to provide a logio low output which in turn causes signal AS to switch to a logic low, thereby terminating the transition pulse which was initiated by the logic low to logic high transition of signal *AF. As a NAND gate, the output of NAND gate 80 cannot switch to a logic low until both of its inputs are a logic high. This is a desirable characteristic of cross-coupled latch 66. This characteristic aids in ensuring that both NAND gate outputs are not a logic low at the same time. For either a rapid or slow change of node 82 from a logic high to a logic low, the output NAND gate 80 cannot switch from a logic high to a logic low until the output of NAND gate 82 has switched to a logic high.

The propagation delay for a logic low to logic high transition of signal AF is that of 4 gates. The 4 gates are NOR gate 61, inverter 62, inverter 65, and NAND gate 80. The propagation delay for a logic low to logic high transition of signal *AF is that of 3 gates. The three gates are NOR gate 61, inverter 62, and NAND gate 79. The propagation delay in switching signal AF in response to a logic low to logic high transition of signal AI can be reduced by deleting inverter 65 and connecting the first input of NAND gate 80 to node 81 as shown by a dotted line 76 in FIG. 3. The logic low to logic high transition of signals *AF and AF is in the critical path of access time because the logic low to logic high transition initiates the transition pulse which in effect is the address transition detection. If the first input of NAND gate 80 is connected to node 81, then it is important that the switch point of inverter 62 be lower than the switch point of the first input of NAND gate 80 so as to provide a voltage range for node 81 in which both NAND gate outputs are a logic high. The reason for this is the same as has previously been explained with respect to inverter 65. A potential disadvantage is that the first input of NAND gate 80 receives a signal with 2 less stages of buffering.

Buffer 60 offers both high speed and high immunity to address float. Inverter 62 and transistors 63 and 64 are effective in adding hysteresis while reducing the speed penalty associated with the capacitance added to the output of inverter 62. A cross-coupled latch adds further margin in avoiding oscillating buffered address signals as well as avoiding simultaneous selection of mutually exclusive decoders. The logic low to logic high transition is the first to occur at the output of the cross-coupled latch which optimizes the speed of detection of a transition of the input signal.

I claim:

1. An input circuit for receiving an input signal and providing an output signal in response thereto, comprising:
   a first transistor of a first conductivity type having a first current electrode coupled to a first power supply terminal, a second current electrode coupled to a switch point control node, and a control electrode for receiving the input signal;
   a second transistor of a second conductivity type having a first current electrode coupled to a second power supply terminal, a second current electrode coupled to the switch point control node, and a control electrode for receiving the input signal;
   an inverter having an input coupled to the switch point control node, and an output;
   load means and a third transistor of the first conductivity type coupled in series between the first power supply terminal and the switch point control node, the third transistor having a control electrode coupled to the output of the inverter and the load means for limiting current through the third transistor; and
   output means, coupled to the inverter, for providing the output signal.

2. The input buffer of claim 1 wherein:
   the third transistor has a first current electrode coupled to the switch point control node, and a second current electrode; and
   the load means is coupled between the first power supply terminal and the second current electrode of the third transistor.

3. The input buffer of claim 2 wherein the first and third transistors are P channel transistors and the second transistor is an N channel transistor.

4. The input buffer of claim 3 wherein the load means is a fourth transistor of the first conductivity type having a first current electrode coupled to the first power supply terminal, a second current electrode coupled to the second current electrode of the third transistor, and a control electrode coupled to the second power supply terminal.

5. The input buffer of claim 4 further comprising:
a fourth transistor of the first conductivity type interposed between the first current electrode of the third transistor and the first power supply terminal, the fourth transistor having a first current electrode coupled to the first power supply terminal, a second current electrode coupled to first current electrode of the third transistor, and a control electrode for receiving a control signal; and
a fifth transistor of the second conductivity type having a first current electrode coupled to the second power supply terminal, a second current electrode coupled to the switch point control node, and a control electrode for receiving the control signal.

6. The input buffer of claim 1 wherein the load means is a fourth transistor of the first conductivity type.

7. The input buffer of claim 6 wherein the third and fourth transistors are coupled in series between the first power supply terminal and the switch point control node, said fourth transistor having a control electrode coupled to the second power supply terminal.

8. The input buffer of claim 7 wherein:
the fourth transistor has a first current electrode coupled to the first power supply terminal, and a second current electrode;
the third transistor has a first current electrode coupled to the second current electrode of the fourth transistor, and a second current electrode coupled to the switch point control node.

9. A memory, comprising:
a plurality of memory cells located at intersections of word lines and bit lines;
a row decoder, coupled to the word lines, for enabling a selected word line as determined by a row address comprised of a plurality of row address signals at first or second logic states;
equalization means, coupled to the bit lines, for equalizing the voltages on the bit lines in response to receiving an equalization signal;
a first inverter having an input for receiving a first row address signal of the plurality of row address signals, and an output;
a second inverter having an input coupled to the output of the first inverter, and an output;
a first transistor having a first control electrode coupled to a first power supply terminal, a second current electrode coupled to the output of the first inverter, and a control electrode coupled to the output of the second inverter;

a cross-coupled latch, coupled to the second inverter, for providing complementary outputs representative of the logic state of the first address signal; and
transition detection means, coupled to the complementary outputs of the cross coupled latch, for initiating the equalization pulse in response to a transition from the first logic state to the second logic state of one of the complementary outputs.

10. The memory of claim 9 further comprising:
a third inverter having an input coupled to the output of the second inverter, and an output; wherein
the cross-coupled latch has a first input coupled to the output of the second inverter, and a second input coupled to the output of the third inverter.

11. The memory of claim 10 wherein the cross-coupled latch comprises:
a first NAND gate having a first input coupled to the output of the second inverter, a second input, and an output for providing a first of the complementary outputs; and
a second NAND gate having a first input coupled to the output of the third inverter, a second input coupled to the output of the first NAND gate, and an output connected to the second input of the first NAND gate for providing a second of the complementary outputs.

12. The memory of claim 11 wherein the first input of the first NAND gate has a first switch point and the third inverter has a second switch point, wherein the first switch point is greater than the second switch point.

13. The memory of claim 9 wherein the cross-coupled latch comprises:
a first NAND gate having a first input coupled to the output of the second inverter, a second input, and an output for providing a first of the complementary outputs; and
a second NAND gate having a first input coupled to the output of the first inverter, a second input coupled to the output of the first NAND gate, and an output connected to the second input of the first NAND gate for providing a second of the complementary outputs.

14. The memory of claim 13 wherein the first input of the second NAND gate has a first switch point and the second inverter has a second switch point, wherein the first switch point is greater than the second switch point.

15. The memory of claim 14 wherein the first inverter is a clocked inverter which is enabled by a chip select signal.

16. The memory of claim 15 wherein the clocked inverter is a NOR gate having a first input for receiving the first address signal, a second input for receiving the chip select signal, and an output coupled to the input of the second inverter.

* * * * *

UNITED STATES PATENT AND TRADEMARK OFFICE
CERTIFICATE OF CORRECTION

PATENT NO. : 4,706,218
DATED : November 10, 1987
INVENTOR(S) : Lal C. Sood

It is certified that error appears in the above-identified patent and that said Letters Patent is hereby corrected as shown below:

Column 13, line 11, insert --a-- before "first".

Column 14, line 5, change "cross coupled to --cross-coupled--.

Signed and Sealed this

Twenty-sixth Day of April, 1988

Attest:

DONALD J. QUIGG

Attesting Officer

Commissioner of Patents and Trademarks